US009194575B2

(12) United States Patent
Sharma et al.

(10) Patent No.: US 9,194,575 B2
(45) Date of Patent: Nov. 24, 2015

(54) THERMAL MANAGEMENT IN OPTICAL AND ELECTRONIC DEVICES

(75) Inventors: Rajdeep Sharma, Sunnyvale, CA (US); Stanton Earl Weaver, Jr., Broadalbin, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 580 days.

(21) Appl. No.: 13/538,746

(22) Filed: Jun. 29, 2012

(65) Prior Publication Data

US 2014/0002990 A1 Jan. 2, 2014

(51) Int. Cl.

| | |
|---|---|
| ***H05K 7/20*** | (2006.01) |
| ***F21V 29/76*** | (2015.01) |
| ***F21V 23/00*** | (2015.01) |
| ***F21K 99/00*** | (2010.01) |
| ***F21V 29/74*** | (2015.01) |

(52) U.S. Cl.

CPC . *F21V 29/76* (2015.01); *F21K 9/13* (2013.01); *F21V 23/004* (2013.01); *F21V 29/74* (2015.01)

(58) Field of Classification Search

None

See application file for complete search history.

(56) References Cited

U.S. PATENT DOCUMENTS 3,847,211 A * 11/1974 Fischel et al. ................. 165/166
6,123,145 A 9/2000 Glezer et al.
6,588,497 B1 7/2003 Glezer et al.
7,932,535 B2 4/2011 Mahalingam et al.
8,030,886 B2 10/2011 Mahalingam et al.
8,081,454 B2 * 12/2011 Ishikawa et al. .............. 361/694
8,881,994 B2 * 11/2014 Wetzel et al. .............. 239/102.1
2006/0196638 A1 9/2006 Glezer et al.
2011/0162823 A1 * 7/2011 Sharma et al. ........... 165/104.34
2011/0316416 A1 12/2011 Han et al.
2012/0098424 A1 4/2012 Arik et al.

FOREIGN PATENT DOCUMENTS

EP 2447992 A2 5/2012

OTHER PUBLICATIONS

PCTUS2013/44896 Search Report and Written Opinion, Sep. 10, 2013.

B. Song et al., "Life prediction of LED based recess downlight cooled by synthetic jet," Microelectronics Raliability, vol. 52, pp. 937-948, 2012.

"Maintaining the Viability of Air-Cooled Thermal Management Through a Variety of Micro-Technologies", (Thermacore) Electronic Products, Oct. 1, 2009, pp. 1-4.

Fang et al., "Experimental Heat Transfer Enhancement for Single Phase Liquid Micro-Channel Cooling Using a Micro-Synthetic Jet Actuator", ASME 2009 2nd Micro/Nanoscale Heat & Mass Transfer International Conference, vol. 3, Dec. 18-21, 2009, pp. 1-8.

Li et al., "Enhancement of natural convection using synthetic jets", ITherm 2010 : 12th IEEE Intersociety Conference on Thermal and Thermomechanical Phenomena in Electronic Systems, pp. 1-8, Jun. 2-5, 2010.

* cited by examiner

*Primary Examiner* — Courtney Smith

(74) *Attorney, Agent, or Firm* — Fletcher Yoder, P.C.

(57) ABSTRACT

A thermal management system for electronic devices is provided. The thermal management system includes a plurality of synthetic jets provided in a stacked arrangement and separated by respective spacers within the stacked arrangement. The stack of synthetic jets may be used to facilitate airflow in the thermal management system, such as to facilitate air flow over a heat sink in one implementation.

9 Claims, 8 Drawing Sheets

THERMAL MANAGEMENT IN OPTICAL AND ELECTRONIC DEVICES

BACKGROUND

The invention relates generally to thermal management and heat transfer, and more particularly to thermal management in optical and electronic devices.

High efficiency lighting systems are continually being developed to compete with traditional area lighting sources, such as incandescent or florescent lighting. While light emitting diodes (LEDs) have traditionally been implemented in signage applications, advances in LED technology have fueled interest in using such technology in general area lighting applications. LEDs and organic LEDs are solid-state semiconductor devices that convert electrical energy into light. While LEDs implement inorganic semiconductor layers to convert electrical energy into light, organic LEDs (OLEDs) implement organic semiconductor layers to convert electrical energy into light. Significant developments have been made in providing general area lighting implementing LEDs and OLEDs.

One potential drawback in LED applications is that during usage, a significant portion of the electricity in the LEDs is converted into heat, rather than light. If the heat is not effectively removed from an LED lighting system, the LEDs will run at high temperatures, thereby lowering the efficiency and reducing the reliability of the LED lighting system. In order to utilize LEDs in general area lighting applications where a desired brightness is required, thermal management systems to actively cool the LEDs may be considered. Providing an LED-based general area lighting system that is compact, lightweight, efficient, reliable and bright enough for general area lighting applications is challenging. While introducing a thermal management system to control the heat generated by the LEDs may be beneficial, the thermal management system itself also introduces a number of additional design challenges.

BRIEF DESCRIPTION

In one embodiment, a synthetic jet stack assembly is provided. The synthetic jet stack assembly comprises a holder component and a plurality of synthetic jet diaphragms disposed within the holder component in a stacked arrangement. Each synthetic jet diaphragm comprises a deformable shim and a piezoelectric element attached to the deformable shim. The synthetic jet stack assembly also comprises a plurality of spacers disposed within the holder component in the stacked arrangement. Each spacer is positioned between a pair of the synthetic jet diaphragms. Each spacer comprises at least one opening through which air flow when the plurality of synthetic jet diaphragms are operated.

In another embodiment, an electronic device is provided. The electronic device comprises one or more heat generating electrical components and a thermal management system. The thermal management system comprises a heat sink in thermal communication with the one or more heat generating electrical components and a stack assembly. The stack assembly comprises a plurality of synthetic jets diaphragms and a plurality of spacers. Each pair of synthetic jet diaphragms is separated by a spacer. Each spacer comprises an opening through which air is expelled during operation of the synthetic jet diaphragms.

In another embodiment, a lighting device is provided. The lighting device comprises at least one light source, electronic circuits configured to drive one or both of the light source and a plurality of synthetic jet diaphragms, and a thermal management system. The thermal management system comprises a heat sink in thermal communication with at least the at least one light source, a holder component configured to hold the plurality of synthetic jet diaphragms in a stacked arrangement, the plurality of synthetic jet diaphragms positioned in the stacked arrangement within the holder component, and a plurality of spacers. A respective spacer is disposed between each pair of synthetic jet diaphragms. Each spacer comprises an opening through which air flows toward the heat sink when the synthetic jet diaphragms are operated.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Aspects of the present disclosure relate generally to LED-based area lighting systems or to other electronic and/or optical devices that utilize, or would benefit from, thermal management (e.g., cooling or other types of heat transfer). For example, in one implementation, a lighting system is provided with driver electronics, LED light source(s), and an active cooling system (i.e., a thermal management system), which includes synthetic jets arranged and secured into the system in a manner which optimizes actuation of the synthetic jets and air flow through thereby providing a more efficient lighting system. The thermal management system includes synthetic jets used to provide an air flow in and out of the lighting system, thereby cooling the lighting system when in operation.

In one embodiment, a lighting system uses a conventional screw-in base (i.e., Edison base) that is connected to the electrical grid. The electrical power is appropriately supplied to the thermal management system and to the light source by the same driver electronics unit. In certain embodiments, synthetic jet devices are provided to work in conjunction with a heat sink having a plurality of fins, and air ports, to both actively and passively cool the LEDs. In one such embodiment, the synthetic jets are arranged in a stacked arrangement and are arranged to provide air flow across fins of a heat sink. As will be described, the synthetic jet devices are operated at a power level sufficient to provide adequate cooling during illumination of the LEDs.

Figure 1:
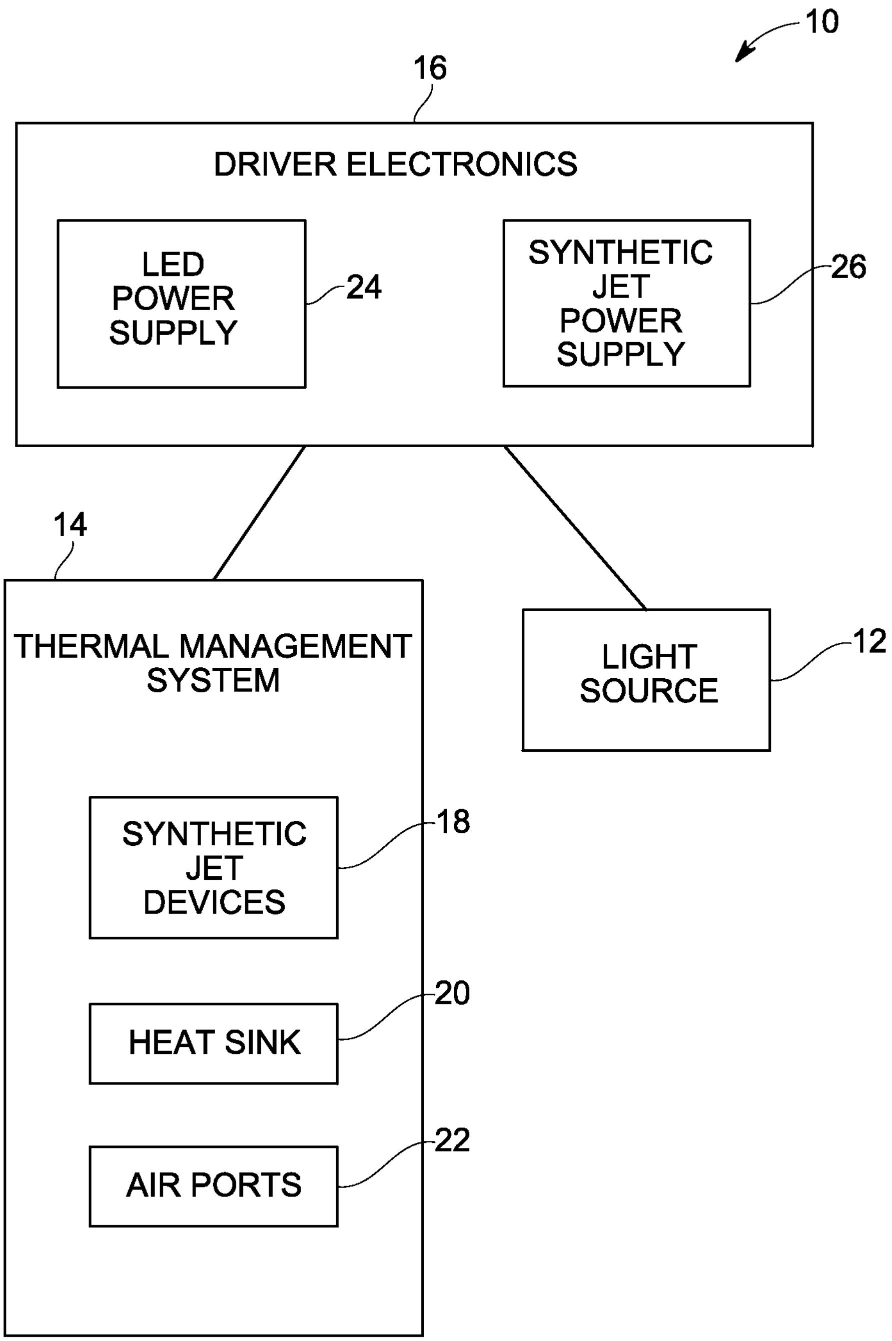
FIG. 1 is block diagram of a lighting system in accordance with aspects of the present disclosure.

Referring now to FIG. 1, a block diagram illustrates an example of an electrical system to be cooled in the form of a lighting system 10. In one embodiment, the lighting system 10 may be a high-efficiency solid-state down-light luminaire or other form of general purpose lighting. In general, the lighting system 10 includes a light source 12, a thermal management system 14, and driver electronics 16 configured to drive each of the light source 12 and the thermal management system 14. As discussed further below, the light source 12 includes a number of LEDs arranged to provide down-light illumination suitable for general area lighting. In one embodiment, the light source 12 may be capable of producing at least approximately 1500 face lumens at 75 lm/W, CRI>80, CCT=2700 k-3200 k, 50,000 hour lifetime at a 100° C. LED junction temperature. Further, the light source 12 may include color sensing and feedback, as well as being angle controlled.

As will also be described further below, the thermal management system 14 is configured to cool the heat generating electronics (such as the LEDs in this example) when in operation. In one embodiment, the thermal management system 14 includes synthetic jet devices 18, heat sinks 20 and air ports (i.e., ventilation slots or holes 22) to provide the desired cooling and air exchange for the lighting system 10. As will be described further below, the synthetic jet devices 18 are arranged and secured in a stacked arrangement that provides the desired level of air flow for cooling.

The driver electronics 16 include an LED power supply 24 and a synthetic jet power supply 26. In accordance with one embodiment, the LED power supply 24 and the synthetic jet power supply 26 each comprise a number of chips and integrated circuits residing on the same system board, such as a printed circuit board (PCB), wherein the system board for the driver electronics 16 is configured to drive the light source 12, as well as the thermal management system 14. By utilizing the same system board for both the LED power supply 24 and the synthetic jet power supply 26, the size of the lighting system 10 may be reduced or minimized. In an alternate embodiment, the LED power supply 24 and the synthetic jet power supply 26 may each be distributed on independent boards.

Figure 2:
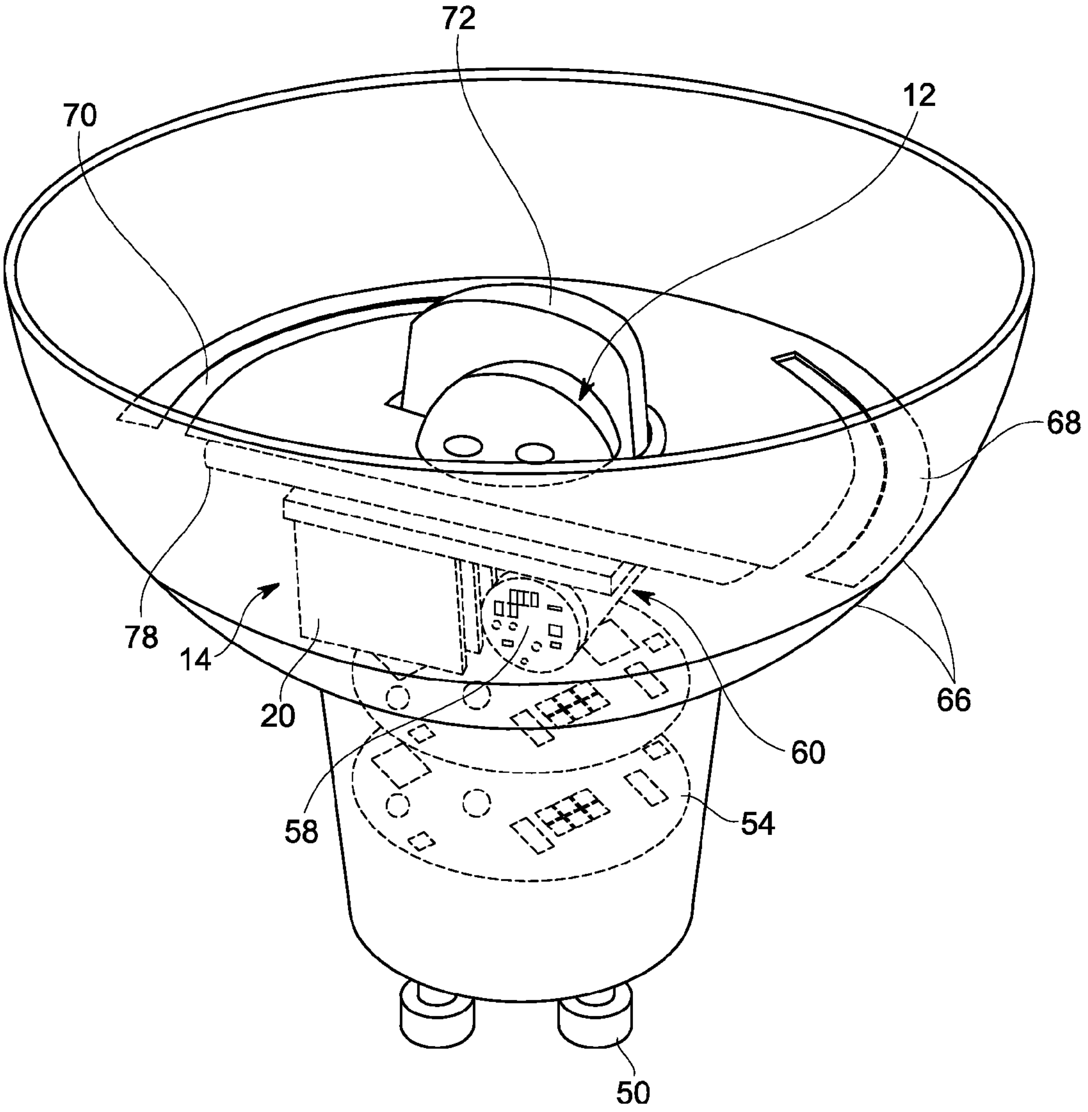
FIG. 2 illustrates a perspective view of a lighting system, in accordance with aspects of the present disclosure.
Figure 3:
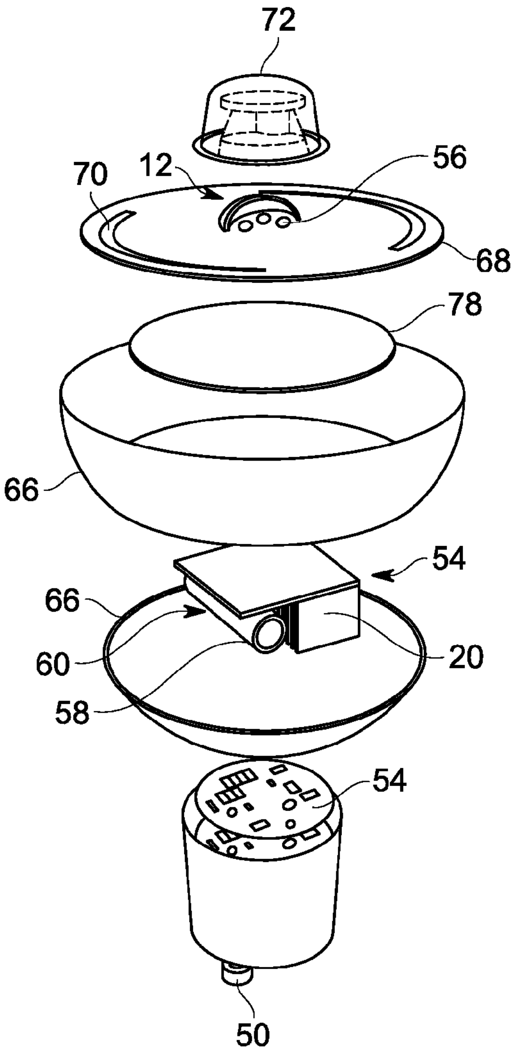
FIG. 3 illustrates an exploded view of the lighting system of FIG. 2, in accordance with aspects of the present disclosure.
Figure 4:
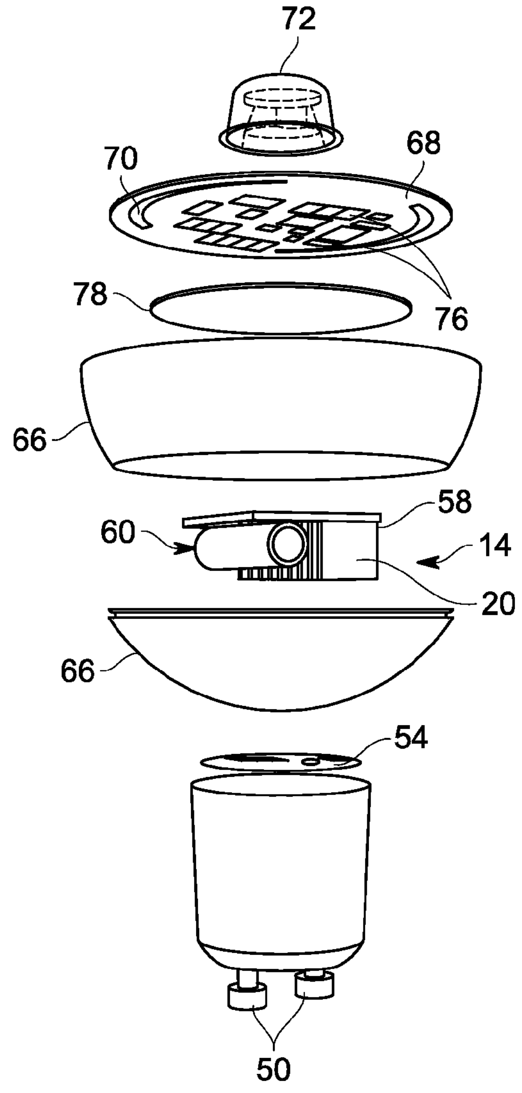
FIG. 4 illustrates another exploded view of the lighting system of FIG. 2, in accordance with aspects of the present disclosure.

Referring now to FIGS. 2-4, FIG. 2 depicts a partial cut-away view of one embodiment of a lighting system 10 (here depicted as a bulb) incorporating a thermal management system as discussed herein. Further, FIGS. 3 and 4 depict perspective, exploded views of the lighting system 10 as depicted in FIG. 2. Turning to the figures, in the depicted example, electrical prongs or contacts 50 are depicted which may be used to connect the lighting system 10 to a powered fixture or socket or to otherwise connect the lighting system to a source of electricity. Lamp electronics 54 are also provided that, when in operation may drive or otherwise control operation of the light elements, e.g., LEDs 56. In certain embodiments, the lamp electronics may also drive or otherwise control operation of the thermal management system 14, though in the depicted example, separate thermal management electronics 58 (e.g., synthetic jet driver electronics) are provided for controlling operation of the thermal management system 14.

In the depicted example, the thermal management system 14 includes a stack 60 or assembly of synthetic jet devices 18, as discussed in greater detail below. In addition, the thermal management system 14 includes a heat sink 20, which may include multiple cooling fins 62 (FIG. 4). In the depicted example, the driver electronics 58 control operation of the synthetic jet devices 18 arranged or assembled in stack 60.

The depicted lighting system 10 also includes various housing structures 66 that house the respective lamp and thermal management electronics 54, 58, the thermal management system 14, and the light source 12 and associated lighting structures or optics 72. In certain embodiments, the housing structure 66 may include reflective surfaces that help direct light generated by the light source 12. In addition, the housing structures 66 may support or encompass a substrate or board 68 on which the light generating components (e.g., LEDs 56) are provided. In the depicted example, the board 68 includes ventilation slots 22 that allow the passage of air to and from the thermal management system 14 and the surrounding environment. As will be appreciated, in other embodiments, ventilation may be provided at different locations (such as in one or more components of the housing structure) and/or in different forms or shapes (such as in the form of holes or other passages as opposed to slots).

Figure 5:
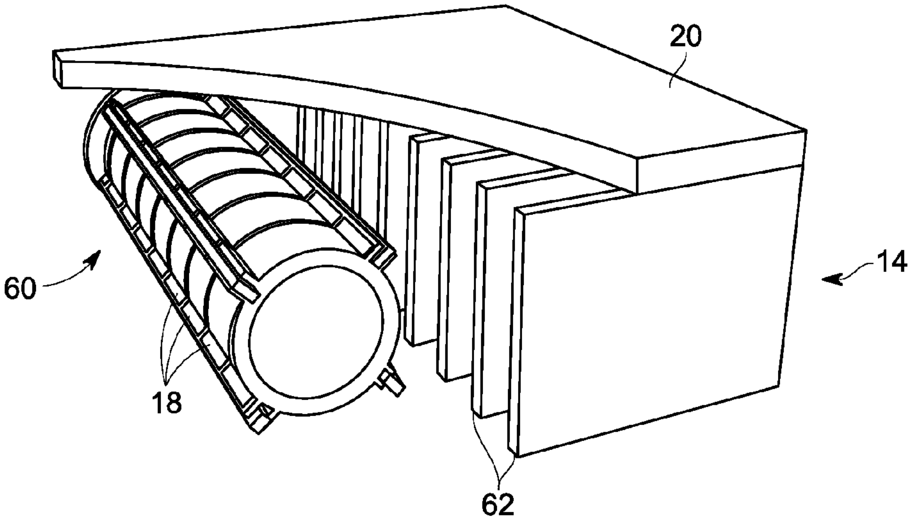
FIG. 5 depicts a portion of a thermal management system, in accordance with aspects of the present disclosure.

In the depicted example, the board 68 on which the LED's are incorporated includes electronics 76 on the face of the board opposite the light emitting portions of the LEDs 56. The heat associated by these LED electronics 76 during operation may be conducted, such as via a thermally conductive compression pad 78, to the heat sink 20. Turning to FIG. 5, a partial cut-away view of the stack 60 of synthetic jets 18 is depicted in conjunction with the heat sink 20, a portion of which is cut-away to better view the stack 60. In operation, heat from the operation of the LED's 56 may be conducted to the heat sink 20. The synthetic jets 18 may then be used to conduct air around the fins 62 of the heat sink 20, thereby dissipating the heat conducted to the heat sink 20 into the surrounding environment.

Figure 6:
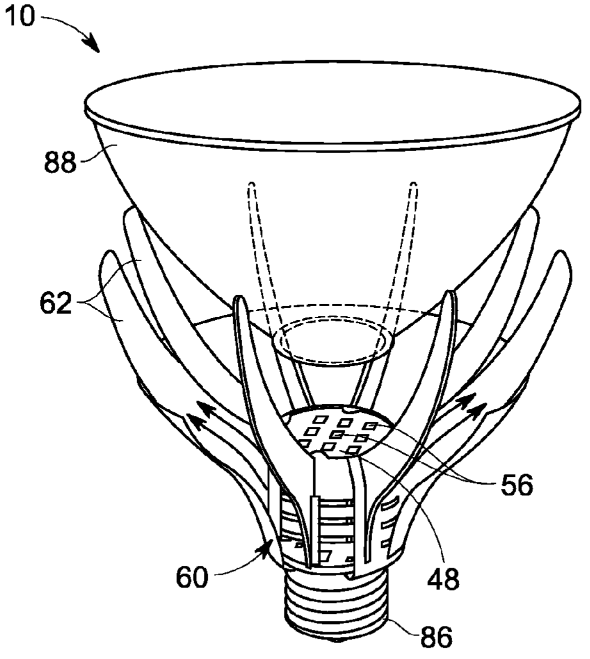
FIG. 6 depicts a view of an additional lighting system, in accordance with aspects of the present disclosure.
Figure 7:
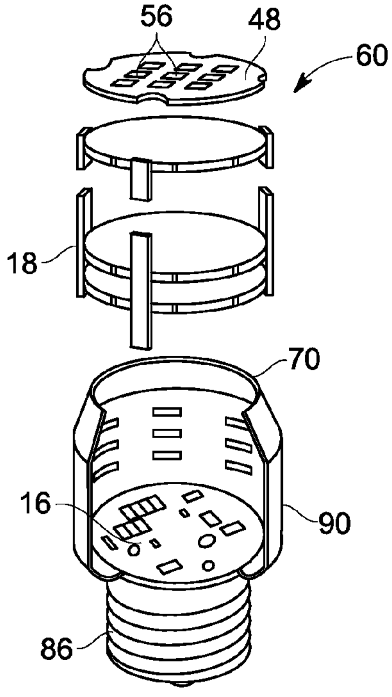
FIG. 7 depicts an exploded and sectional view of the base of the lighting system of FIG. 6, in accordance with aspects of the present disclosure.

While FIGS. 2-5 depict one example of an embodiment of a lighting system 10, FIGS. 6 and 7 depict an example of an additional embodiment, with FIG. 6 depicting a partially cut-away exploded view of the lighting device 10 and FIG. 7 depicting a cut-away exploded view of the base of the lighting device, including the electronics and portions of the thermal management system.

In this example, the lighting system 10 includes a conventional screw-in base (Edison base) 86 that may be connected to a conventional socket that is coupled to the electrical power grid. A reflector 88 forms part of the housing structure for the lighting system 10 and is fitted to the system 10 so as to reflect and direct light generated by the LEDs 56. In the depicted example, a set of heat sink cooling fins 62 are positioned about the reflector 88 and allow the dissipation of heat generated by the LED electronics to the external environment.

In one implementation, the cooling fins 62 are thermally coupled to a cage 90 that also forms part of the housing structure for the lighting system 10 as well as serving as part of the heat sink of the thermal management system 14. The cage 90 surrounds, in the depicted example, the power or driver electronics 16 for the LEDs 56 as well as for the synthetic jet devices 18. In accordance with the illustrated embodiment, all of the electronics configured to provide power for the LEDS 56, as well as the synthetic jet devices 18 are contained on a single printed circuit board. Thus, in accordance with the depicted implementation, the light source and the active components of the thermal management system share the same input power. In other embodiments, the respective power and driver electronics for these systems may be disposed on different boards or structures.

The cage 90 may include various ventilation slots or holes 22 through which air flows to assist in the cooling of the depicted lighting system 10. In the depicted example, the cage 90 also houses a stack 60 of synthetic jet devices 18, as discussed herein. The synthetic jet devices 18 facilitate the flow of air in and out of the cage 90, thereby helping to cool the heat generating components of the lighting system 10. As will be appreciated, any variety of fastening mechanisms may be included to secure the components of the lighting system 10, within the various depicted housing structures, such that the lighting system 10 is a single unit, once assembled for use.

Figure 8:
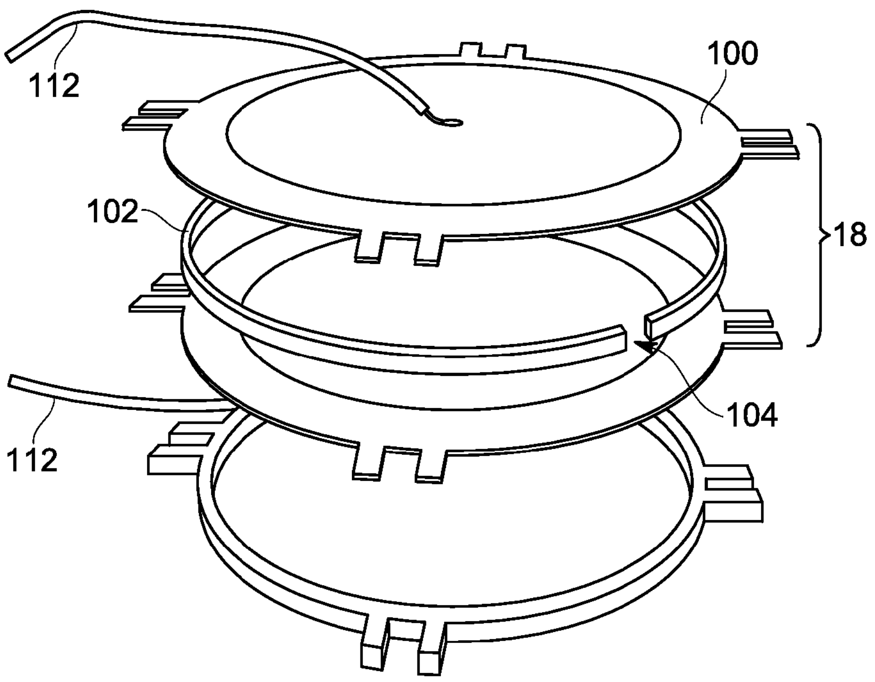
FIG. 8 depicts an exploded view of components of a synthetic jet, in accordance with aspects of the present disclosure.

With respect to the synthetic jet devices 18 of the thermal management system 14 described above, in certain embodiments the synthetic jet devices 18 are arranged proximate to the fins 62 of a heat sink 20. In such a configuration, each synthetic jet device 18, when operated, causes the flow of air across the faceplate and between the fins 62 to provide cooling of the LEDs 56. With respect to these synthetic jets, and turning to FIG. 8, each synthetic jet device 18 typically includes one or more diaphragms 100 which are configured to be driven by the synthetic jet power supply 26 such that the diaphragm 100 moves rapidly back and forth within a hollow frame or spacer 102 (i.e., up and down with respect to the frame 102) to create an air jet through an opening in the frame 102 which may be directed through the gaps between the fins 62 of the heat sink 20. In one embodiment, the spacer is composed of elastomeric material and the wall of the spacer 102 is approximately 0.25 mm thick. In certain implementations, the spacer 102 may also include a passage or space for one or more wire 112 or flex circuits to pass through, thereby allowing an electrical connection to be made between the structures of the diaphragm 100 and the external driver circuitry.

Figure 9:
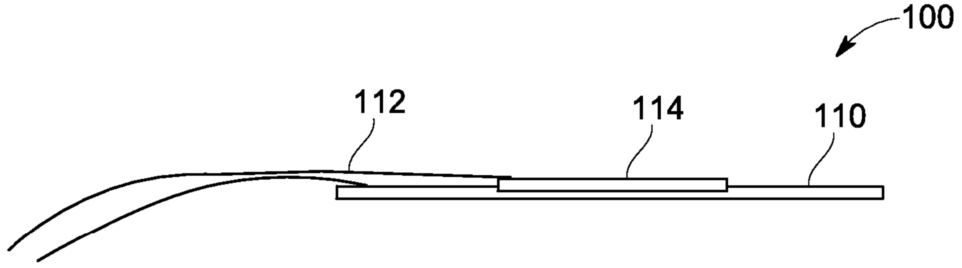
FIG. 9 depicts a side view of a diaphragm of a synthetic jet, in accordance with aspects of the present disclosure.
Figure 10:
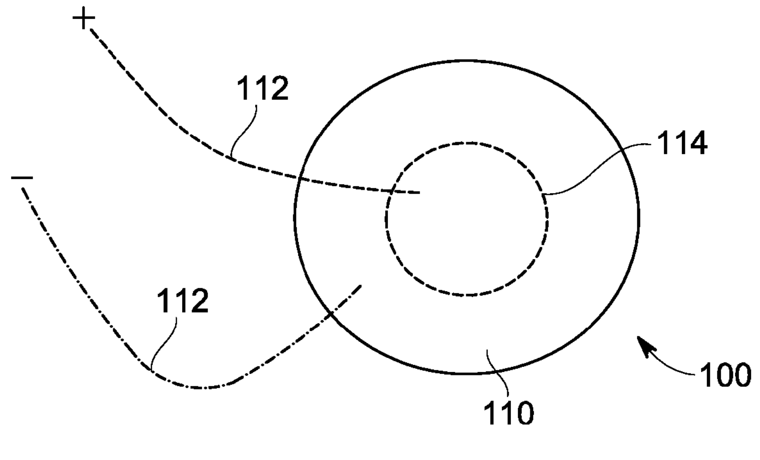
FIG. 10 depicts a plan view of a diaphragm of a synthetic jet, in accordance with aspects of the present disclosure.
Figure 11:
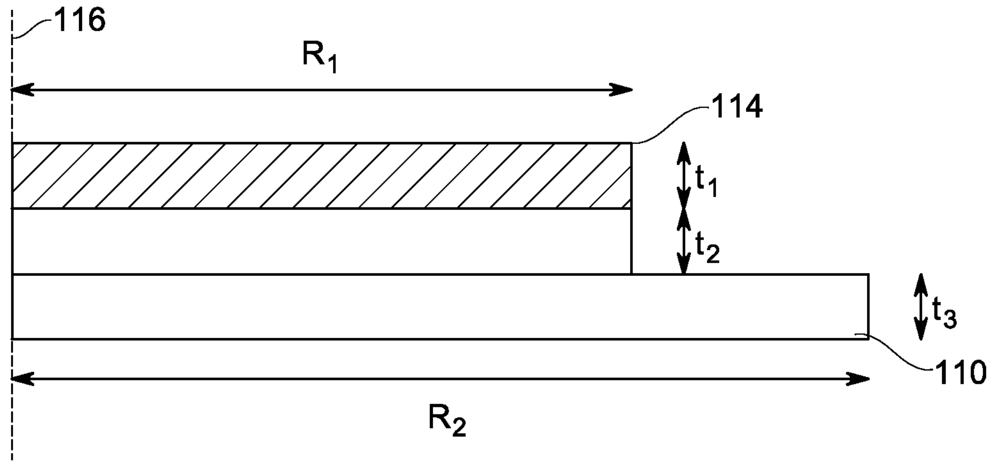
FIG. 11 depicts an axi-symmetric layer view of one embodiment of a diaphragm of a synthetic jet, in accordance with aspects of the present disclosure.

Turning to FIGS. 9-11, in one implementation, the diaphragm 100 consists of a metal shim 110 (such as a steel or stainless steel plate) that is attached to a piezoelectric material 114 (such as a PZT-5A (lead zirconate titanate) material). In one example, the piezoelectric material 114 may be attached to the shim 110 using epoxy or other suitable adhesive compositions. As depicted in FIG. 11, an axo-symmetric representation (i.e., with respect to axis of symmetry 116) of a cross section through one embodiment of such a diaphragm 100 is depicted. In this example, the piezoelectric material 114 is mounted on a stainless steel shim 110 that is etched on one surface to have a radius ($R_1$) with respect to the axis of symmetry 116 that corresponds to the radius of the piezoelectric material 114. The remainder of the shim 110, however, is not etched and has a different radius ($R_2$) with respect to the axis of symmetry 116. In other embodiments, the shim 110 may not have an etched surface and may, thus, have only a single radius ($R_2$) with respect to the axis of symmetry 116. In certain implementations, the corresponding diameter of the diaphragm 100 is about or less than 25 mm, allowing a synthetic jet formed using the diaphragm 100 to fit within a conventional light socket base (e.g., and Edison base). In addition, the piezoelectric element 114 and the shim 110 have respective thickness $t_1$, $t_2$, and $t_3$) that help determine the operational characteristics of the diaphragm 100. As will be appreciated, in implementations where the shim 110 is not etched, there may only be a single thickness associated with the shim 110 (e.g., $t_3$ in the depicted example).

By way of example, in one implementation, the radius of the piezoelectric material 114 ($R_1$) (and etched surface of the shim 110, if present) is about 6.75 mm and the radius ($R_2$) of the shim material 110 (or the unetched portion of the shim material, if applicable) is about 7.5 mm. In this example, the piezoelectric material 114 may have a thickness ($t_1$) of about 0.1 mm while the shim 110 may have combined thicknesses of about 0.075 mm ($t_2$) and 0.075 mm ($t_3$) if etched or a total thickness of about 0.075 mm if the shim 110 is not etched. In such an implementation, the ratio of the thickness to diameter when clamped (as discussed below) would be approximately 0.075 mm/15 mm, or about 0.005.

Similarly, in another implementation the radius ($R_1$) of the piezoelectric material 114 (and etched surface of the shim 110, if present) is about 9 mm and the radius ($R_2$) of the shim material 110 (or the unetched portion of the shim material, if applicable) is about 10 mm. In this example, the piezoelectric material 114 may have a thickness ($t_1$) of about 0.1 mm while the shim 110 may have combined thicknesses of about 0.16 mm ($t_2$) and 0.16 mm ($t_3$) if etched or a total thickness of about 0.16 mm if the shim 110 is not etched. In such an implementation, the ratio of the thickness to diameter when clamped (as discussed below) would be approximately 0.16 mm/20 mm, or about 0.008.

In a further implementation the radius ($R_1$) of the piezoelectric material 114 (and etched surface of the shim 110, if present) is about 9 mm and the radius ($R_2$) of the shim material 110 (or the unetched portion of the shim material, if applicable) is about 10 mm. In this example, the piezoelectric material 114 may have a thickness ($t_1$) of about 0.05 mm while the shim 110 may have combined thicknesses of about 0.15 mm ($t_2$) and 0.15 mm ($t_3$) if etched or a total thickness of about 0.15 mm if the shim 110 is not etched. In such an implementation, the ratio of the thickness to diameter when clamped (as discussed below) would be approximately 0.15 mm/20 mm, or about 0.0075.

With the foregoing examples in mind, in operation electrical control signals, delivered by wires 112 or other conductive structures (e.g., flexible circuits), are applied to the piezoelectric material 114, which in response deforms or otherwise imparts a mechanical strain to the attached shim 110, causing flexion of the shim 110 with respect to the frame (i.e., spacer 102). The flexion of the shim 110 in turn causes the volume of an otherwise defined space to vary, and thereby causes air motion in and out of the defined space.

For example, turning back to FIG. 8, in one embodiment, a synthetic jet assembly 18 may include two diaphragms 100 spaced apart by a frame (i.e., a spacer) 102 having an orifice 104. The synchronized operation of the diaphragms 100 (i.e., flexion of the shims 110) propels air from the interior space defined by the diaphragms 100 and spacer 102 through the orifice 104. The air pushed through the orifice 104 may be directed to a part of a heat sink 20, such as a cooling fin 62, to dissipate heat conducted to the heat sink 20. In certain embodiments, the may have a height of about 0.55 mm to about 0.75 mm and a width of about 0.55 mm to about 0.75 mm.

Figure 12:
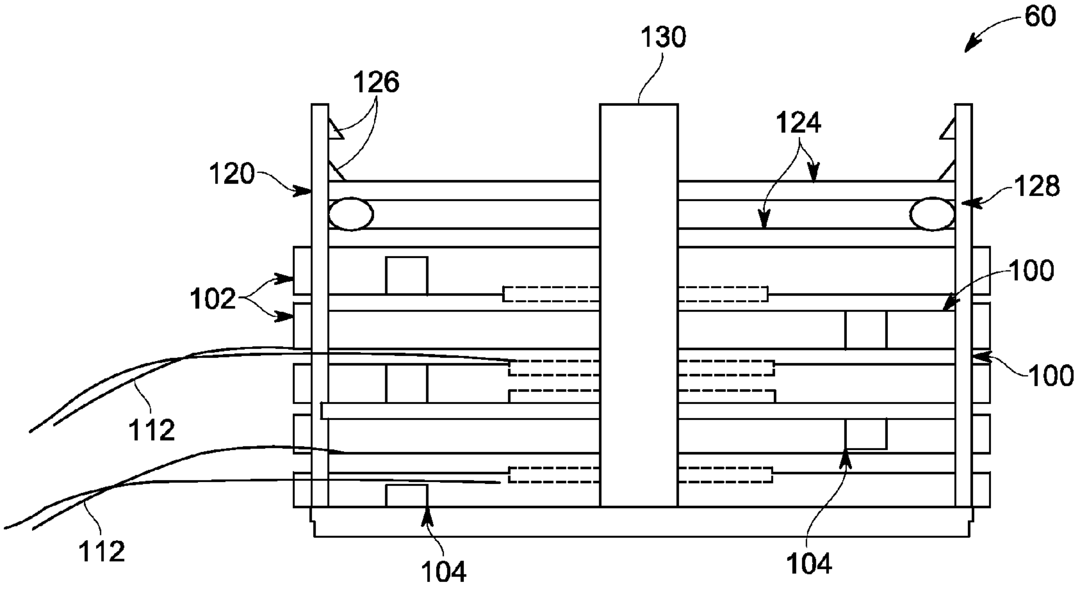
FIG. 12 depicts a sectional view of a stack of synthetic jets, in accordance with aspects of the present disclosure.
Figure 13:
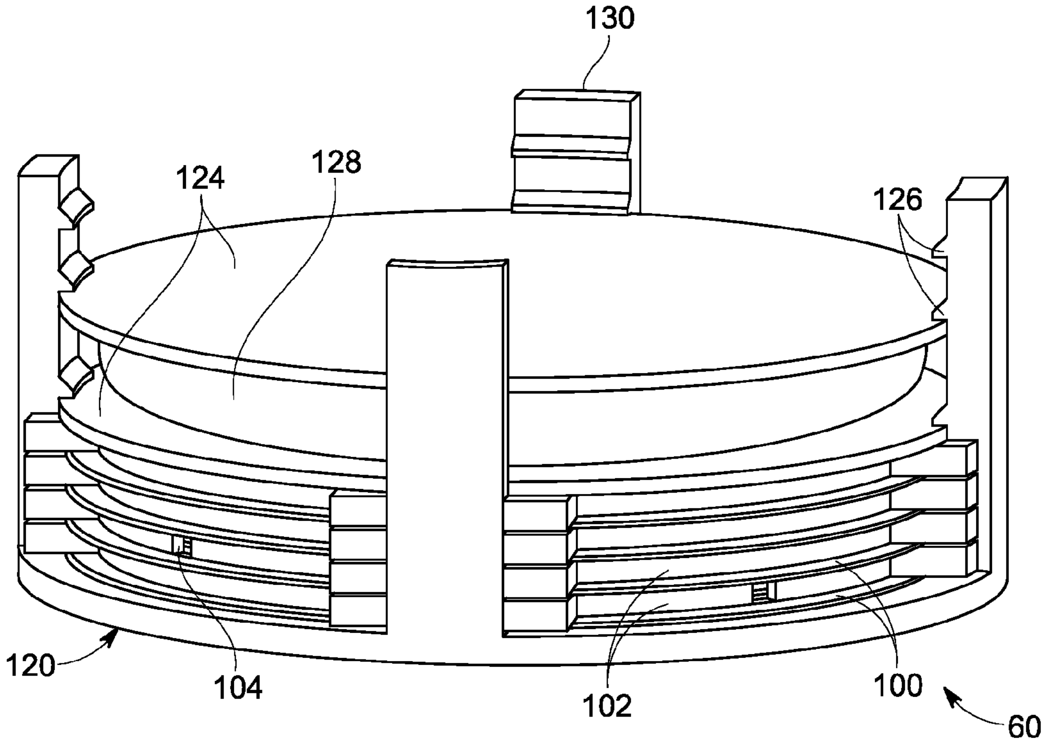
FIG. 13 depicts a perspective view of a stack of synthetic jets, in accordance with aspects of the present disclosure.

As noted above, in certain embodiments the synthetic jet devices 18 described herein are formed or assembled as a stack 60 so as to provide efficient cooling as part of a thermal management system 14. By way of example, and turning to FIGS. 12 and 13, multiple synthetic jets or piezoelectric actuators may be arranged or assembled as a stack to improve air flow and heat removal from an electrical device. In certain embodiments, a mechanical clamping device 120 for arranging synthetic jets may be employed. The clamping device 120 may include a holder 122 in which diaphragms 100 spaced apart by spacers 102 are arranged to form a stack 60 of synthetic jets 18. The clamping device 120 allows flexibility in the number of diaphragms 100 and spacers 102 (i.e., synthetic jets 18) employed in the stack and the positions and/or orientations of the openings 104 with respect to the heat sink 20 and/or ventilation slots or holes 22. In the depicted example, the holder 122 includes spaced apart posts 130 that are complementary to notches provided in one or both of the spacers 102 or diaphragms 100 such that the notches in the spacer 102 and/or diaphragms 100 may be engaged with the corresponding posts 130 when assembling the stack 60.

In the depicted example, the diaphragms 100 and spacers 102 are held in the holder 122 by one or more clamping plates 124 that in turn may be held in place by teeth or other engagement features 126 of the holder 12, such as on the depicted posts 130 of the holder 122. In one embodiment, the clamping plates are flat metal plates, each having a thickness of about 250μ. In the depicted example, a compressible ring 128 (such as a silicone O-ring) is positioned between two clamping plates 124 and the combination of the size of the compressible ring 128, the durometer of the compressible ring 128, and the placement of the engagement features 126 with which the clamping plates 124 are engaged, determine the clamping pressure applied to the stacked diaphragms 100 and spacers 102 (i.e., synthetic jets). While the present example depicts a pair of clamping plates 124 with an O-ring disposed between, in other embodiments, a single clamping plate 124 may be employed, such an in an embodiment where the O-ring rests directly on the uppermost diaphragm 100 and a single clamping plate 124 secures the O-ring, diaphragms 100, and spacers 102 in the stack assembly.

In one embodiment, the stack 60 of synthetic jets may be assembled and positioned so that the openings 104 through which air flows when the synthetic jets operate is directed toward the heat sink 20, such as to flow over cooling fins 62 of the heat sink 20. In one implementation, the stacked set of diaphragms 100 are operated in phase or in an otherwise coordinated manner such that the motion of each diaphragm 100 is synchronized with the motion of the adjacent diaphragms 100 so that air is expelled through the respective openings 104 separating the diaphragms 100 when two diaphragms both flex inward into the space defined by a given spacer 102.

That is, the flexion of a respective diaphragm may be synchronized with the diaphragm above and the diaphragm below the respective diaphragm such that when the respective diaphragm and the diaphragm below flex toward one another, air is expelled through the opening 104 in the spacer 102 separating these two diaphragms. Conversely, when the respective diaphragm and the diaphragm above flex toward one another, air is expelled through the opening 104 in the spacer 102 separating these two diaphragms. In this manner, air may be expelled from the stack 60 of synthetic jets in a substantially continuous manner during operation.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An electronic device, comprising:

one or more heat generating electrical components; and a thermal management system, comprising:

a heat sink in thermal communication with the one or more heat generating electrical components;

a stack assembly comprising:

a plurality of synthetic jet diaphragms; and a plurality of spacers, wherein each pair of synthetic jet diaphragms is separated by a respective spacer of the plurality of spacers to form a respective synthetic jet and wherein each spacer comprises an opening through which air is expelled during operation of the synthetic jet diaphragms, wherein a plurality of synthetic jets are defined by the plurality of synthetic jet diaphragms and the plurality of spacers such that each synthetic jet comprises a respective upper diaphragm and a respective lower diaphragm separated by a respective spacer and wherein each synthetic jet shares at least one diaphragm with an adjacent diaphragm.

2. The electronic device of claim 1, wherein the stack assembly further comprises a holder component in which the plurality of synthetic jets diaphragms and the plurality of spacers are positioned.

3. The electronic device of claim 2, comprising:

at least one clamping plate configured to engage with one or more engagement features of the holder component; and an compressible ring positioned between at least one clamping plate and the stack assembly.

4. The electronic device of claim 1, wherein the one or more heat generating components comprise a light source.

5. The electronic device of claim 1, wherein the heat sink comprises one or more cooling fins and wherein the respective openings of the one or more spacers are positioned so as cause air to flow over the one or more cooling fins.

6. The electronic device of claim 1, wherein the thermal management system comprises one or more ventilation slots or holes through which air moves when the plurality of synthetic jet diaphragms operate.

7. The electronic device of claim 1, comprising a thermal interface structure positioned between the one or more heat generating electrical components and the heat sink.

8. The electronic device of claim 1, wherein each synthetic jet diaphragm has a diameter less than 25 mm.

9. The electronic device of claim 1, wherein the stack assembly is positioned within a screw-in base of the electronic device.

* * * * *